United States Patent
Moon et al.

(10) Patent No.: US 8,698,146 B2
(45) Date of Patent: Apr. 15, 2014

(54) ORGANIC LIGHT EMITTING DISPLAY DEVICE AND METHOD OF MANUFACTURING THE SAME

(75) Inventors: Sang-Ho Moon, Yongin (KR); Ki-Nyeng Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 320 days.

(21) Appl. No.: 13/230,754

(22) Filed: Sep. 12, 2011

(65) Prior Publication Data

US 2012/0074408 A1 Mar. 29, 2012

(30) Foreign Application Priority Data

Sep. 24, 2010 (KR) .................. 10-2010-0092853

(51) Int. Cl.

| H01L 29/04 | (2006.01) |
|---|---|
| H01L 29/10 | (2006.01) |
| H01L 31/00 | (2006.01) |
| H01L 29/08 | (2006.01) |
| H01L 35/24 | (2006.01) |
| H01L 51/00 | (2006.01) |
| H01L 29/18 | (2006.01) |
| H01L 33/00 | (2010.01) |

(52) U.S. Cl.
USPC .......... 257/59; 257/40; 257/88; 257/E33.064; 257/E51.019

(58) Field of Classification Search
USPC ..................... 257/E29.29, E33.064, E51.019
See application file for complete search history.

(56) References Cited

U.S. PATENT DOCUMENTS

| 7,745,243 | B2 * | 6/2010 | Chen et al. ..................... 438/30 |
| 2010/0182552 | A1 * | 7/2010 | Park et al. ..................... 349/114 |
| 2011/0073855 | A1 * | 3/2011 | Lin ................. 257/43 |
| 2011/0084257 | A1 | 4/2011 | Kwon et al. |
| 2011/0111540 | A1 * | 5/2011 | Shin ................. 438/29 |
| 2011/0114960 | A1 * | 5/2011 | Lee et al. ..................... 257/71 |
| 2012/0098008 | A1 * | 4/2012 | Song et al. ..................... 257/98 |

FOREIGN PATENT DOCUMENTS

| JP | 2000349298 A | 12/2000 |
| KR | 100717758 B1 | 5/2007 |
| KR | 10-2007-0065588 A | 6/2007 |
| KR | 10-2011-0039061 A | 4/2011 |

* cited by examiner

*Primary Examiner* — Daniel Luke
(74) *Attorney, Agent, or Firm* — Christie, Parker & Hale, LLP (57) ABSTRACT

An organic light emitting display device includes: a thin-film transistor (TFT) including an active layer, a gate electrode including a gate bottom electrode and a gate top electrode, a source electrode, and a drain electrode; an organic electroluminescent (EL) device electrically connected to the TFT and including a stack of a pixel electrode at the same layer as and including the same material as the gate bottom electrode, an intermediate layer including an emissive layer, and a counter electrode; a first pad electrode at the same layer as and including the same material as the gate bottom electrode; and a second pad electrode including a second pad bottom electrode at the same layer as and including the same material as the gate bottom electrode, and a second pad top electrode at the same layer as and including the same material as the gate top electrode.

15 Claims, 5 Drawing Sheets

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2010-0092853, filed on Sep. 24, 2010, in the Korean Intellectual Property Office, the disclosure of which is incorporated herein in its entirety by reference.

BACKGROUND

1. Field

The present invention relates to an organic light emitting display device and a method of manufacturing the same.

2. Description of Related Art

A flat panel display device, such as an organic light emitting display device or a liquid crystal display device, is fabricated on a substrate including a thin-film transistor (TFT), a capacitor, and a wiring for connecting the TFT and the capacitor.

Generally, to form a fine pattern including a TFT on a substrate on which a flat panel display device is fabricated, such a fine pattern is transferred onto an array substrate by using a mask on which the fine pattern is formed.

Generally, a pattern is transferred by using a mask in a photolithography operation. In a photolithography operation, a photoresist is uniformly applied on a substrate on which a pattern is to be formed, the photoresist is exposed to light by using exposure equipment, such as a stepper, and, when using a positive photoresist, the photoresist exposed to light is developed. Furthermore, after the photoresist is developed, a pattern is etched by using remaining portions of the photoresist as a mask and the remaining portions of the photoresist are then removed.

In an operation of transferring a pattern by using a mask as described above, a mask including a necessary pattern is prepared in advance. Therefore, cost of preparing masks increases as the number of operations using masks increases. Furthermore, such an operation includes complicated steps as described above. Therefore, overall manufacturing time and manufacturing cost increase.

SUMMARY

Exemplary embodiments according to the present invention provide an organic light emitting display device that may be manufactured through a simplified manufacturing process and exhibits improved brightness due to improved resistance uniformity at a pad unit and a method of manufacturing the same.

According to an aspect of an embodiment of the present invention, there is provided an organic light emitting display device including: a thin-film transistor (TFT) including an active layer, a gate electrode including a gate bottom electrode and a gate top electrode, a source electrode, and a drain electrode; an organic electroluminescent (EL) device electrically connected to the TFT and including a stack of a pixel electrode at the same layer as and including the same material as the gate bottom electrode, an intermediate layer including an emissive layer, and a counter electrode; a first pad electrode at the same layer as and including the same material as the gate bottom electrode; and a second pad electrode including a second pad bottom electrode at the same layer as and including the same material as the gate bottom electrode, and a second pad top electrode at the same layer as and including the same material as the gate top electrode.

Two opposite ends of the second pad electrode may be electrically connected to the first pad electrode, and the second pad electrode may extend in a direction parallel to the first pad electrode.

The organic light emitting display device may further include one or more insulation layers covering the second pad electrode.

The organic light emitting display device may further include one or more insulation layers covering at least portions of the TFT, the organic EL device, the first pad electrode, and the second pad electrode, wherein at least one insulation layer of the one or more insulation layers has one or more openings, and the one or more openings and the second pad electrode do not overlap each other.

An end of the first pad electrode may be exposed and may be electrically connected to a driver IC for supplying a current for driving the organic light emitting display device.

At least a part of a current input via the first pad electrode may be transmitted to the TFT and the organic EL device via the second pad electrode.

The gate bottom electrode, the pixel electrode, the first pad electrode, and the second pad bottom electrode may include one or more of ITO, IZO, ZnO, or $In_2O_3$.

The gate top electrode and the second pad top electrode may include one or more materials selected from among Ag, Mg, Al, Pt, Pd, Au, Ni, Nd, Ir, Cr, Li, Ca, Mo, Ti, W, MoW, Al/Cu, or combinations thereof.

The gate top electrode and the second pad top electrode may have a triple layer structure of Mo—Al—Mo.

According to another aspect of an embodiment according to the present invention, there is provided an organic light emitting display device including: a first insulation layer on a substrate; an active layer of a TFT on the first insulation layer; a second insulation layer covering the active layer; a pixel electrode on the second insulation layer; a gate bottom electrode on the active layer and at the same layer as and including the same material as the pixel electrode; a first pad electrode at the same layer as and including the same material as the gate bottom electrode and spaced from the gate bottom electrode; a second pad bottom electrode at the same layer as and including the same material as the first pad electrode and electrically connected to the first pad electrode; a gate top electrode on the gate bottom electrode; a second pad top electrode on the same layer as and including the same material as the gate top electrode and on the second pad bottom electrode; a third insulation layer covering at least portions of the pixel electrode, the gate top electrode, the first pad electrode, and the second pad top electrode; and a source electrode and a drain electrode on the third insulation layer, one of the source electrode or the drain electrode contacting the pixel electrode.

The second pad electrode may have a U-shape, and ends of the U-shaped second pad electrode may be connected to the first pad electrode.

At least a part of a current input via the first pad electrode may be transmitted to the TFT and an organic EL device via the second pad electrode.

The gate bottom electrode, the pixel electrode, the first pad electrode, and the second pad bottom electrode may include one or more of ITO, IZO, ZnO, or $In_2O_3$.

The gate top electrode and the second pad top electrode may include one or more materials selected from among Ag, Mg, Al, Pt, Pd, Au, Ni, Nd, Ir, Cr, Li, Ca, Mo, Ti, W, MoW, Al/Cu, or combinations thereof.

The gate top electrode and the second pad top electrode may have a triple layer structure of Mo—Al—Mo.

According to another aspect of an embodiment of the present invention, there is provided a method of manufacturing an organic light emitting display device, the method including: performing a first masking operation for forming an active layer of a TFT on a substrate; performing a second masking operation for forming a gate electrode, a second pad electrode, and electrode patterns for forming a pixel electrode and a first pad electrode on the active layer; performing a third masking operation for forming an interlayer insulation layer having an opening that exposes two opposite ends of the active layer and a portion of the electrode patterns; performing a fourth masking operation for forming source and drain electrodes that respectively contact the two opposite exposed ends of the active layer, the pixel electrode, and the first pad electrode; and performing a fifth masking operation for forming a pixel define layer that exposes at least a portion of the pixel electrode.

The performing the second masking operation may include: depositing a second insulation layer, a first conductive layer, and a second conductive layer sequentially on the active layer; forming the gate electrode, using the first conductive layer as a gate bottom electrode and the second conductive layer as a gate top electrode, and the second pad electrode, using the first conductive layer as a second pad bottom electrode and the second conductive layer as a second pad top electrode, by patterning the first conductive layer and the second conductive layer.

The performing the third masking operation may include: depositing a third insulation layer on the gate electrode and the electrode patterns; and forming an opening for exposing portions of source and drain regions of the active layer and portions of the electrode patterns by patterning the third insulation layer.

The performing the fourth masking operation may include: depositing a third conductive layer on the interlayer insulation layer; and forming the source and drain electrodes by patterning the third conductive layer.

The performing the fourth masking operation may include: forming the source and drain electrodes; and forming the pixel electrode and the first pad electrode, using a first conductive layer as electrodes, by removing portions of a second conductive layer constituting the electrode patterns.

The performing the fifth masking operation may include: stacking a fourth insulation layer on a top surface of the substrate; and forming the pixel define layer by patterning the fourth insulation layer.

The first conductive layer may include one or more of ITO, IZO, ZnO, or $In_2O_3$.

The second conductive layer may include one or more materials selected from among Ag, Mg, Al, Pt, Pd, Au, Ni, Nd, Ir, Cr, Li, Ca, Mo, Ti, W, MoW, Al/Cu, or combinations thereof.

The second conductive layer may have a triple layer structure of Mo—Al—Mo.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
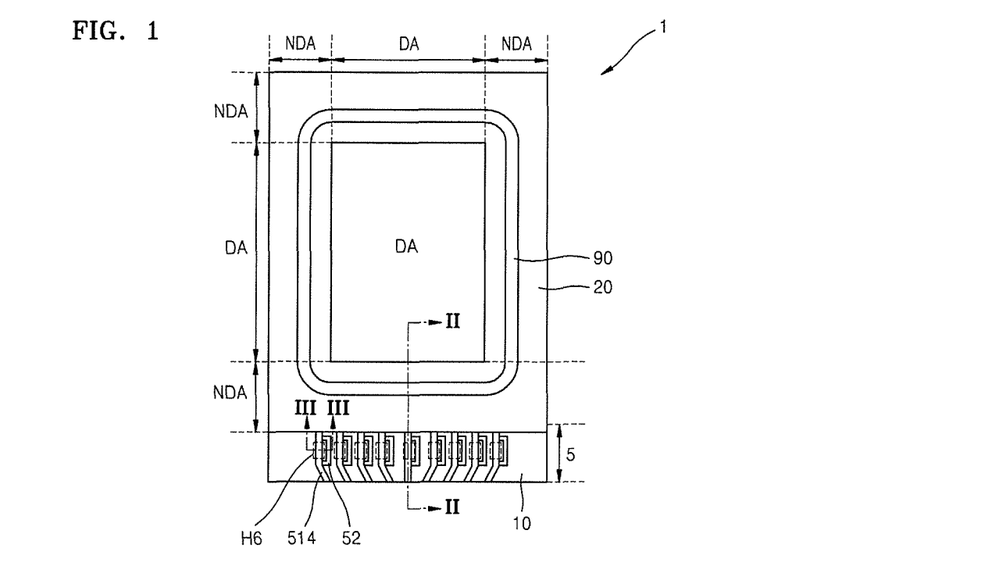
FIG. 1 is a plan view showing a structure of an organic light emitting display device according to an embodiment of the present invention.

The present invention will now be described more fully with reference to the accompanying drawings, in which exemplary embodiments of the present invention are shown. The present invention may, however, be embodied in many different forms and should not be construed as being limited to the embodiments set forth herein; rather, these embodiments are provided so that this disclosure will be thorough and complete, and will fully convey the concept of the present invention to those skilled in the art FIG. 1 is a plan view showing a structure of an organic light emitting display device 1 according to an embodiment of the present invention.

The organic light emitting display device 1 includes a first substrate 10 including thin-film transistors (TFTs) and light emitting pixels, and a second substrate 20 adhered to the first substrate 10 via a seal/sealant.

A plurality of TFTs, a plurality of organic electroluminescent (EL) devices, and a plurality of storage capacitors Cst may be formed on the first substrate 10. Furthermore, the first substrate 10 may be a crystalline silicon (e.g., a low temperature polycrystalline silicon (LTPS)) substrate, a glass substrate, a plastic substrate, a stainless steel (SUS) substrate, or the like.

The second substrate 20 may be an encapsulating substrate arranged on the first substrate 10 to keep outside moisture and air from the TFTs and light emitting pixels formed on the first substrate 10. The second substrate 20 is positioned to face the first substrate 10, and the first substrate 10 and the second substrate 20 are adhered to each other via sealing members 90 arranged along edges of the first substrate 10 and the second substrate 20. The second substrate 20, for example, may be a transparent glass substrate or a transparent plastic substrate.

The first substrate 10 includes a luminescent region DA, from which light is emitted, and a non-luminescent region NDA surrounding the luminescent region DA. According to embodiments of the present invention, the sealing members 90 are arranged in the non-luminescent region NDA to adhere the first substrate 10 and the second substrate 20 to each other.

As described above, organic EL devices, TFTs for driving the organic EL devices, and wiring electrically connected to them, are formed in the luminescent region DA of the first substrate 10. Furthermore, the non-luminescent region NDA may include a pad region 5, on which a pad electrode is connected to the wiring of the luminescent region DA.

Here, the pad region 5 includes a first pad electrode 514 and a second pad electrode 52 in the organic light emitting display device 1 according to an embodiment of the present invention, and detailed descriptions thereof will be given below with reference to FIG. 2.

Figure 2:
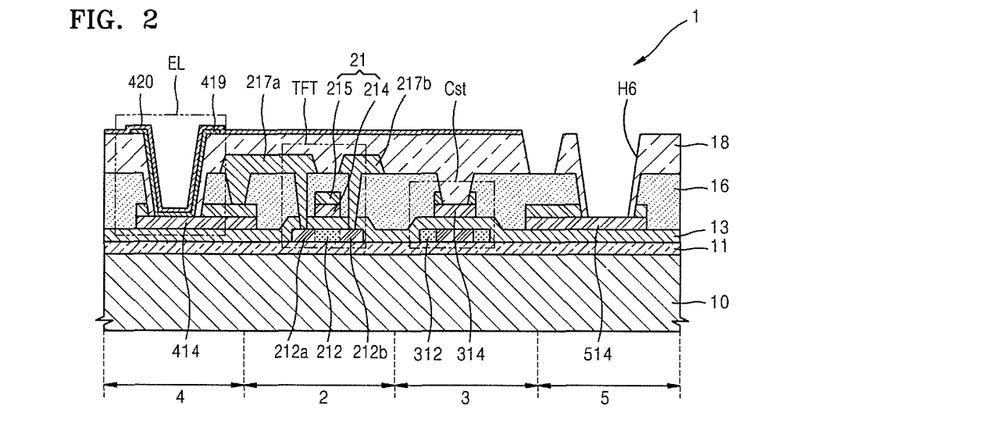
FIG. 2 is a sectional view taken along the line II-II of FIG. 1.

FIG. 2 is a sectional view taken along the line II-II of FIG. 1.

Referring to FIG. 2, the organic light emitting display device 1 according to an exemplary embodiment of the present invention includes a channel region 2, a storage region 3, a luminescent region 4, and the pad region 5.

In the channel region 2, a TFT is arranged as a driving device. The TFT includes an active layer 212, a gate electrode 21, and source/drain electrodes 217a and 217b. The gate electrode 21 includes a gate bottom electrode 214 and a gate top electrode 215, wherein the gate bottom electrode 214 may be formed of a transparent conductive material. A second insulation layer 13 is interposed between the gate electrode 21 and the active layer 212 for insulation therebetween. Furthermore, source/drain regions 212a and 212b densely doped with an impurity, and respectively connected to the source/drain electrodes 217a and 217b, are formed on two opposite sides of the active layer 212.

A storage capacitor Cst is arranged in the storage region 3. The storage capacitor Cst includes a capacitor bottom electrode 312 and a capacitor top electrode 314, wherein the second insulation layer 13 is interposed therebetween. Here, the capacitor bottom electrode 312 may be formed on the same layer by using the same material as the active layer 212 of the TFT. Meanwhile, the capacitor top electrode 314 may be formed on the same layer by using the same material as the gate bottom electrode 214 of the TFT, a pixel electrode 414 of an organic EL device, the first pad electrode 514, and a second pad bottom electrode (524 of FIG. 3) of the second pad electrode 52.

The luminescent region 4 includes the organic EL device. The organic EL device includes the pixel electrode 414, which is connected to the source electrode 217a or the drain electrode 217b of the TFT, a counter electrode 420 formed to face (or opposite) the pixel electrode 414, and an intermediate layer 419 interposed therebetween. The pixel electrode 414 is formed of a transparent conductive material, and may be formed on the same layer by using the same material as the gate bottom electrode 214 of the TFT.

Figure 3:
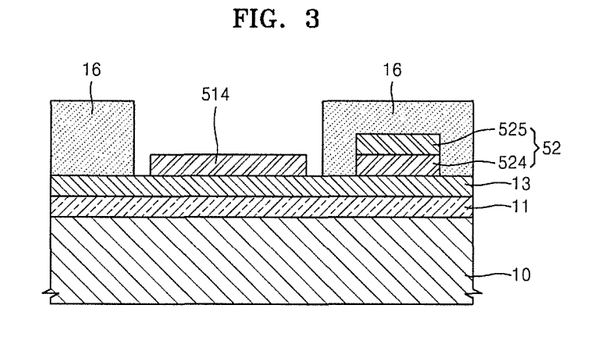
FIG. 3 is a schematic sectional view taken along the line III-III of FIG. 1.

The pad region 5 includes the first pad electrode 514 and the second pad electrode 52 (shown in FIG. 1), wherein the second pad electrode 52 includes the second pad bottom electrode (524 of FIG. 3) and a second pad top electrode (525 of FIG. 3).

Here, the first pad electrode 514 and the second pad bottom electrode (524 of FIG. 3) may be formed on the same layer by using the same material as the gate bottom electrode 214 of the TFT, the capacitor top electrode 314, and the pixel electrode 414 of the organic EL device. Furthermore, the second pad top electrode (525 of FIG. 3) may be formed on the same layer by using the same material as the gate top electrode 215. A detailed description of the pad region 5 will be give below.

FIG. 3 is a schematic sectional view taken along the line III-III of FIG. 1

Referring to FIGS. 1, 2, and 3, the organic light emitting display device 1 according to an embodiment of the present invention is formed having the pad region 5 including the first pad electrode 514 and the second pad electrode 52.

In detail, with respect to a conventional organic light emitting display device, a pad electrode is generally formed by patterning a third conductive layer (17 of FIG. 10) for forming the source/drain electrodes 217a and 217b, and the third conductive layer (17 of FIG. 10) is generally formed of Mo—Al—Mo. However, such a pad electrode formed of Mo—Al—Mo is typically easily corroded. Therefore, a method of forming a pad electrode by using a transparent electrode, such as one formed of ITO, has been introduced. In detail, according to one embodiment, a gate electrode may have a double-layer structure, such as the gate electrode 21 including the gate bottom electrode 214 and the gate top electrode 215. Here, the gate bottom electrode 214 may include one or more materials selected from among transparent materials such as ITO, IZO, ZnO, or $In_2O_3$, whereas the gate top electrode 215 may include one or more materials selected from among Ag, Mg, Al, Pt, Pd, Au, Ni, Nd, Ir, Cr, Li, Ca, Mo, Ti, W, MoW, Al/Cu, or combinations thereof. Furthermore, a method of forming a pad electrode by using a first conductive layer (14 of FIG. 6) for forming the gate bottom electrode 214 has been introduced. However, if a pad electrode is formed by using ITO as described above, due to ITO having a relatively high electric resistance, most of a current entering into the luminescent region DA flows in only a portion of the ITO pad electrode close to the luminescent region DA, and a current entering from below the ITO pad electrode travels along a relatively high resistance path until the current is finally input to the luminescent region DA. Therefore, uniformity of contact resistances in a pad electrode is relatively low, and thus, brightness of the luminescent region DA is relatively low.

Therefore, in the organic light emitting display device 1 according to an embodiment of the present invention, the pad region 5 is formed to include the first pad electrode 514 and the second pad electrode 52.

Here, the second pad electrode 52 according to one embodiment is formed as a bypass electrode that branches off from an end of the first pad electrode 514, extends in a direction parallel to the first pad electrode 514, and rejoins the first pad electrode 514. Here, the first pad electrode 514 may be formed as a single layer including one or more materials selected from among transparent materials such as ITO, IZO, ZnO, or $In_2O_3$, is exposed via an opening H6, and contacts a driver IC. The second pad electrode 52 may be formed as a double layer including the second pad top electrode 525 and the second pad bottom electrode 524. Here, the second pad bottom electrode 524 may be formed of the same material by using the same material as the first pad electrode 514. The second pad top electrode 525 may include one or more materials selected from among Ag, Mg, Al, Pt, Pd, Au, Ni, Nd, Ir, Cr, Li, Ca, Mo, Ti, W, MoW, or Al/Cu, and may be formed to have a triple layer structure of Mo—Al—Mo. Furthermore, the second pad electrode 52 is formed to be covered by a third insulation layer 16, so that the second pad electrode 52 is not exposed.

In this case, a current entering from above the first pad electrode 514 directly enters into the luminescent region DA via the first pad electrode 514, whereas a current entering from below the first pad electrode 514 is mostly transmitted to the second pad bottom electrode 524, which has a relatively low resistance, and is input to the luminescent region DA via the second pad bottom electrode 524 instead of via the first pad electrode 514, which has a relatively high resistance.

Accordingly, problems of a conventional ITO single pad electrode may be solved. In other words, in the related art, the first pad electrode 514, which is only formed of ITO, may exhibit an excessively high resistance. However, a resistance of a path traveled by a current to reach the luminescent region DA may be reduced by adding the second pad electrode 52, which includes Mo—Al—Mo and has a relatively low resistance. Therefore, uniformities of contact resistances in the first pad electrode 514 and the second pad electrode 52 are improved, and thus, uniformity of brightness may be improved. Furthermore, since the third insulation layer 16 prevents the second pad electrode 52, which is formed of easily corroded Mo—Al—Mo, from being exposed to outside elements, reliability of the organic light emitting display device 1 may also be improved.

Hereinafter, a process of manufacturing a bottom emission type organic light emitting display device as shown in FIG. 2 will be described briefly. FIGS. 4 through 12 are sectional views for briefly depicting steps of the process of manufacturing a bottom emission type organic light emitting display device as shown in FIG. 2.

Figure 4:
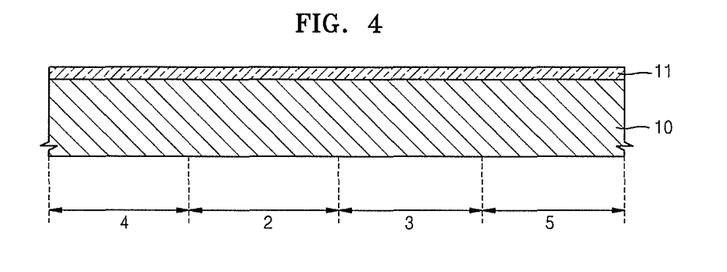
FIGS. 4 through 12 are sectional views for briefly depicting steps of the process of manufacturing a bottom emission type organic light emitting display device as shown in FIG. 2.

First, as shown in FIG. 4, a first insulation layer 11 is formed on the substrate (e.g., first substrate) 10. For example, the substrate 10 may be formed of a SiO$_2$-based transparent glass material. However, the present invention is not limited thereto, and the substrate 10 may be formed of any of various suitable materials, such as a transparent plastic material or a metal.

The first insulation layer 11 may be formed on a top surface of the substrate 10 as a barrier layer and/or as a buffer layer for preventing or reducing diffusion of impurity ions, for preventing or reducing permeation of moisture and outside air, and for planarizing the top surface of the substrate 10. The first insulation layer 11 may be formed by depositing SiO$_2$ and/or SiN$_x$ using any of various deposition methods, such as plasma enhanced chemical vapor deposition (PECVD), atmospheric pressure CVD (APCVD), or low pressure CVD (LPCVD).

Figure 5:
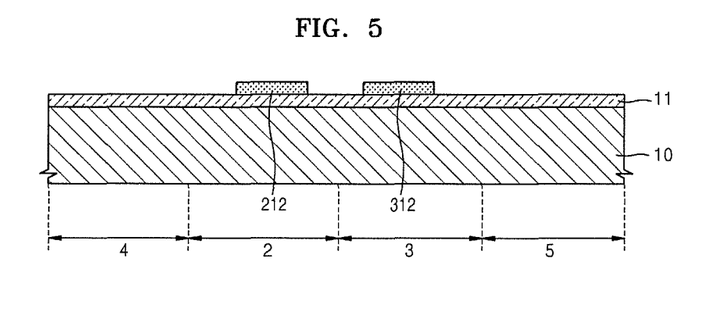

Next, as shown in FIG. 5, the active layer 212 of the TFT and the capacitor bottom electrode 312 of the storage capacitor Cst are formed on a top surface of the first insulation layer 11. For example, an amorphous silicon is first deposited on the top surface of the first insulation layer 11, and a poly-silicon layer (not shown) is formed by crystallizing the deposited amorphous silicon. The amorphous silicon may be crystallized using any of various suitable methods, such as rapid thermal annealing (RTA), solid phase crystallization (SPC), excimer laser annealing (ELA), metal induced crystallization (MIC), metal induced lateral crystallization (MILC), or sequential lateral solidification (SLD). Furthermore, such a poly-silicon layer is patterned into the active layer 212 of the TFT and the capacitor bottom electrode 312 of the capacitor Cst in a masking operation using a first mask (not shown).

Although the active layer 212 and the capacitor bottom electrode 312 are separately formed in the present embodiment, the active layer 212 and the capacitor bottom electrode 312 may also be formed as a single body.

Figure 6:
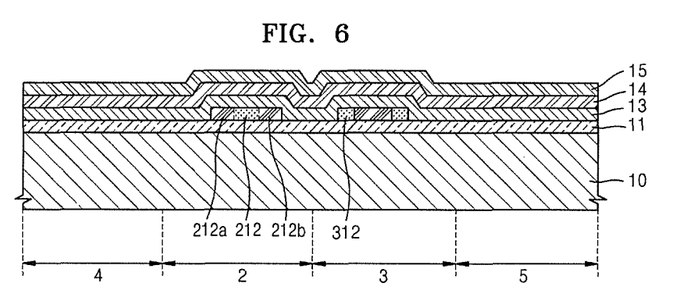

Next, as shown in FIG. 6, the second insulation layer 13, a first conductive layer 14, and a second conductive layer 15 are deposited on (e.g., over or above) the top surface of the substrate 10, on which the active layer 212 and the capacitor bottom electrode 312 are formed, in the order stated.

The second insulation layer 13 may be formed by depositing an inorganic insulation film formed of SiN$_x$ or SiO$_x$ using a method such as PECVD, APCVD, or LPCVD. The second insulation layer 13 is interposed between the active layer 212 of the TFT and the gate electrode 21 (shown in FIG. 7) and functions as a gate insulation layer of the TFT, and is interposed between the capacitor top electrode 314 (shown in FIG. 7) and the capacitor bottom electrode 312 and functions as a dielectric layer of the capacitor Cst.

The first conductive layer 14 may include one or more materials selected from transparent materials including ITO, IZO, ZnO, or In$_2$O$_3$. The first conductive layer 14 may later be patterned into the pixel electrode 414 (shown in FIG. 7), the gate bottom electrode 214 (shown in FIG. 7), the capacitor top electrode 314 (shown in FIG. 7), the first pad electrode 514 (shown in FIG. 7), and the second pad bottom electrode 524 (shown in FIG. 3).

The second conductive layer 15 may include one or more materials selected from among Ag, Mg, Al, Pt, Pd, Au, Ni, Nd, Ir, Cr, Li, Ca, Mo, Ti, W, or MoW. In one embodiment, the second conductive layer 15 may be formed to have a triple layer structure of Mo—Al—Mo. The second conductive layer 15 may later be patterned into the gate top electrode 215 (shown in FIG. 7) and the second pad top electrode 525 (shown in FIG. 3).

Figure 7:
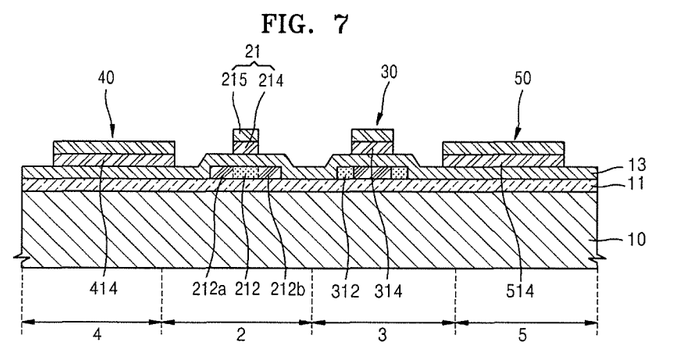

Next, as shown in FIG. 7, the gate electrode 21, electrode patterns 30, 40, and 50, and the second pad electrode 52 (shown in FIG. 3) are formed on the substrate 10.

In detail, the first conductive layer 14 and the second conductive layer 15, which are sequentially stacked on the top surface of the substrate 10, are patterned in a masking operation using a second mask (not shown).

Here, the gate electrode 21 is formed on top of the active layer 212 in the channel region 2, and the gate electrode 21 includes the gate bottom electrode 214, which is formed from a part of the first conductive layer 14, and the gate top electrode 215, which is formed from a part of the second conductive layer 15.

Here, the gate electrode 21 is formed in correspondence to a center (e.g., a channel region) of the active layer 212, and the source/drain regions 212a and 212b are formed at two opposite ends of the active layer 212 corresponding to two opposite ends of the gate electrode 21 with the channel region interposed therebetween. The source/drain regions 212a and 212b are formed by implanting an n-type or p-type impurity into the active layer 212 by using the gate electrode 21 as a mask.

In the storage region 3, the electrode pattern 30 for later forming the capacitor top electrode 314 is formed on top of the capacitor bottom electrode 312. In the luminescent region 4, the electrode pattern 40 for later forming the pixel electrode 414 is formed.

Furthermore, the electrode pattern 50 for later forming a pad electrode is formed in the pad region 5. Furthermore, the second pad electrode 52 is formed in the pad region 5, where the second pad electrode 52 includes the second pad bottom electrode 524 (shown in FIG. 3), which is formed from a part of the first conductive layer 14, and the second pad top electrode 525 (shown in FIG. 3), which is formed from a part of the second conductive layer 15.

Figure 8:
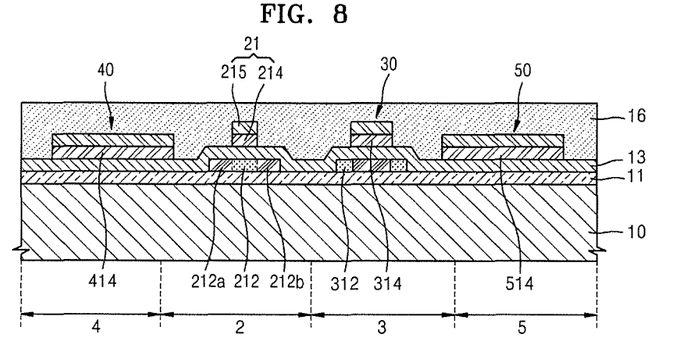

Next, as shown in FIG. 8, the third insulation layer 16 is deposited on the top surface of the substrate 10, on which the gate electrode 21 is formed.

The third insulation layer 16 is formed of one or more organic insulation materials selected from the group consisting of polyimide, polyamide, acrylic resins, benzocyclobutene, and phenol resins by using a method such as spin coating. The third insulation layer 16 is formed to have a thickness, for example, greater than that of the second insulation layer 13, and functions as an interlayer insulation layer between the gate electrode 21 and the source/drain electrodes 217a and 217b (shown in FIG. 11) of the TFT. Furthermore, the third insulation layer 16 may not only be formed of an organic insulation material as described above, but instead be formed of an inorganic material, like the second insulation layer 13. Alternatively, the third insulation layer 16 may be formed by alternately stacking organic insulation material layers and inorganic insulation material layers.

Figure 9:
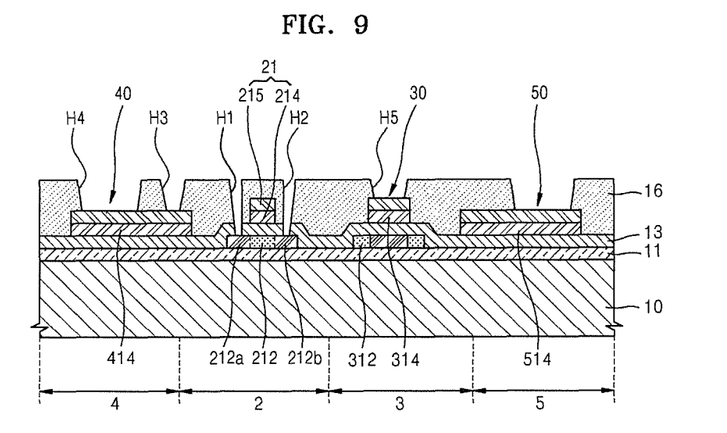

Next, as shown in FIG. 9, the third insulation layer 16 is patterned to have openings H1 through H6 for exposing portions of the electrode patterns 30, 40, and 50 and the source/drain regions 212a and 212b.

For example, the openings H1 through H6 are formed by patterning the third insulation layer 16 in a masking operation using a third mask (not shown). Here, the openings H1 and H2 respectively expose portions of the source/drain regions 212a and 212b, the openings H3 and H4 expose portions of the second conductive layer 15 constituting upper portions of the electrode pattern 40, the opening H5 exposes a portion of the second conductive layer 15 constituting an upper portion of the electrode pattern 30, and the opening H6 exposes a portion of the second conductive layer 15 constituting an upper portion of the electrode pattern 50.

Figure 10:
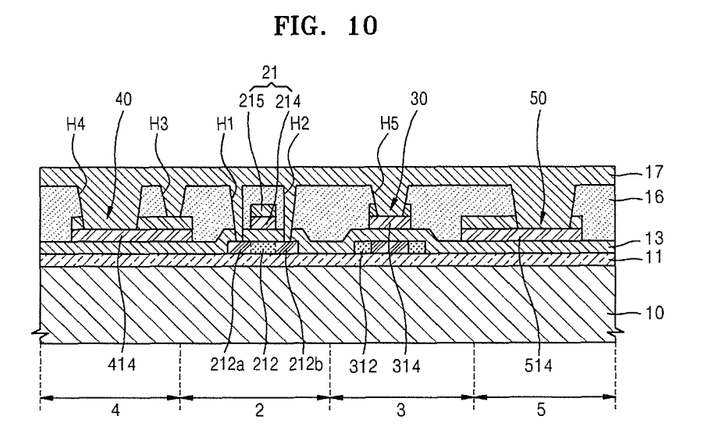

Next, as shown in FIG. 10, the third conductive layer 17 is deposited on the top surface of the substrate 10 to cover the interlayer insulation layer 16.

The third conductive layer 17 may be formed of a conductive material selected from among materials for forming the first conductive layer 14 or the second conductive layer 15 as described above. However, the present invention is not limited thereto, and the third conductive layer 17 may be formed of any of various suitable conductive materials. Furthermore, the conductive material is deposited to a thickness sufficient to fill the openings H1 through H6.

Figure 11:
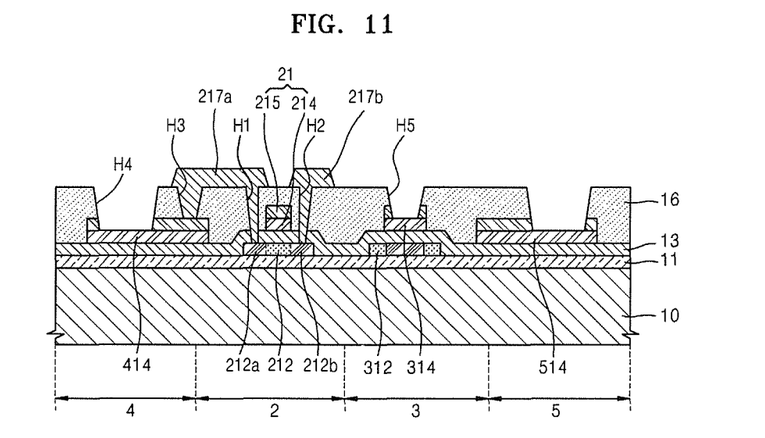

Next, as shown in FIG. 11, the source/drain electrodes 217a and 217b, the pixel electrode 414, the capacitor top electrode 314, and the first pad electrode 514 are formed by patterning the third conductive layer 17.

For example, the source/drain electrodes 217a and 217b may be formed by patterning the third conductive layer 17 in a masking operation using a fourth mask (not shown).

Here, one of the source/drain electrodes 217a and 217b (217a in the present embodiment) is formed to be connected to the pixel electrode 414 via the opening H3 at a portion of the second conductive layer 15 on the electrode pattern 40 for forming the pixel electrode 414.

After the source/drain electrodes 217a and 217b are formed, the pixel electrode 414 and the capacitor top electrode 314 may be formed by further etching the second conductive layer 15. For example, the pixel electrode 414 may be formed by removing a portion of the second conductive layer 15 corresponding to the electrode pattern 40 exposed by the opening H4. Furthermore, the capacitor top electrode 314 may be formed by removing a portion of the second conductive layer 15 corresponding to the electrode pattern 30 exposed by the opening H5. Furthermore, the first pad electrode 514 may be formed by removing a portion of the second conductive layer 15 corresponding to the electrode pattern 50 exposed by the opening H6.

Accordingly, in one embodiment, the gate bottom electrode 214, the capacitor top electrode 314, the pixel electrode 414, the first pad electrode 514, and the second pad bottom electrode 524 are formed on the same layer by using the same material.

Here, the capacitor bottom electrode 312 may be doped by implanting an n-type or p-type impurity via the opening H5. The impurity may be the same as or different from the impurity implanted into the active layer 212.

Figure 12:
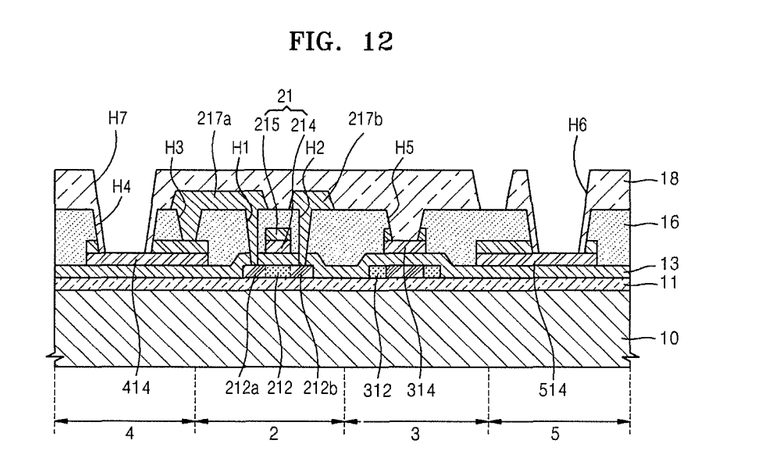

Next, as shown in FIG. 12, a pixel define layer (PDL) is formed on the substrate 10.

For example, a fourth insulation layer 18 may be deposited on the top surface of the substrate 10, on which the pixel electrode 414, the source/drain electrodes 217a and 217b, the capacitor top electrode 314, and the first pad electrode 514 are formed. Here, the fourth insulation layer 18 may be formed of one or more organic insulation materials selected from the group consisting of polyimide, polyamide, acrylic resins, benzocyclobutene, and phenol resins by using a method such as spin coating. Furthermore, the fourth insulation layer 18 may also be formed of an organic insulation material selected from among $SiO_2$, $SiN_X$, $Al_2O_3$, $CuO_x$, Tb407, Y203, Nb205, Pr203, or combinations thereof. Furthermore, the fourth insulation layer 18 may be formed by alternately stacking organic insulation material layers and inorganic insulation material layers.

The PDL 18 may be formed by forming an opening H7 to expose a center of the pixel electrode 414 by patterning the fourth insulation layer 18 in a masking operation using a fifth mask (not shown).

Next, as shown in FIG. 2, the intermediate layer 419, which includes an emissive layer, and the counter electrode 420 are formed in the opening H7 exposing the pixel electrode 414.

The intermediate layer 419 may be formed by stacking an emissive layer (EML) and one or more function layers, such as a hole transport layer (HTL), a hole injection layer (HIL), an electron transport layer (ETL), and an electron injection layer (EIL), in a single structure or in a composite structure.

The intermediate layer 419 may be formed of an organic monomer material or an organic polymer material.

When forming the intermediate layer 419 by using an organic monomer material, an HTL and an HIL are stacked between an EML and the pixel electrode 414, whereas an ETL and an EIL are stacked between the EML and the counter electrode 420. Furthermore, any of various layers may be stacked if required. Furthermore, any of various suitable organic materials such as copper phthalocyanine (CuPC), N,N'-Di(naphthalene-1-yl)-N,N'-diphenyl-benzidine (NPB), or tris-8-hydroxyquinoline aluminum (Alq3) may be applied thereto.

When forming the intermediate layer 419 by using an organic polymer material, only an HTL may be stacked between an EML and the pixel electrode 414. The HTL may be formed on the pixel electrode 414 by using poly-(2,4)-ethylene-dihydroxy thiophene (PEDOT) or polyaniline (PANI) by using a method such as inkjet printing or spin coating. Here, any of suitable organic polymer materials based on poly-phenylenevinylene (PPV) or polyfluorene may be used, and a color pattern may be formed by using a general method, such as inkjet printing, spin coating, or thermal transfer using laser.

The counter electrode 420 may be deposited on the top surface of the substrate 10 as a common electrode. In case of an organic light emitting display device according to the present embodiment, the pixel electrode 414 is used as an anode electrode, and the counter electrode 420 is used as a cathode electrode. The polarities of the electrodes may be reversed in other embodiments.

In case of a bottom emission type organic light emitting display device, in which an image is emitted toward the substrate 10, the pixel electrode 414 becomes a transparent electrode, whereas the counter electrode 420 becomes a reflective electrode. Here, the reflective electrode may be formed by depositing a metal with a small work function, e.g., Ag, Mg, Al, Pt, Pd, Au, Ni, Nd, Ir, Cr, Li, Ca, LiF/Ca, LiF/Al, or a compound thereof, as a thin film.

In each of the masking operations for forming an organic light emitting display device as described above, stacked layers may be removed by dry-etching or wet-etching.

In a bottom emission type organic light emitting display device according to an embodiment of the present invention, a metal layer is formed on a bottommost portion of a substrate in isolation from a pixel electrode without increasing a number of masks for masking operations to improve light emitting efficiency of the pixel electrode and to secure etching characteristics of a gate electrode. Therefore, display quality of the organic light emitting display device may be improved, a process for manufacturing the organic light emitting display device may be simplified, and defects of manufactured organic light emitting display devices may be reduced.

Although an organic light emitting display device of the present invention is described above in reference to certain exemplary embodiments, the present invention is not limited thereto and may be applied to any of various display devices, such as a liquid crystal display device.

Furthermore, although the drawings for describing embodiments of the present invention show one TFT and one capacitor only, it is merely for convenience of explanation and the present invention is not limited thereto. As long as a number of masking operations according to the present invention is not increased, a plurality of TFTs and a plurality of capacitors may be employed.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light emitting display device comprising:
   a thin-film transistor (TFT) comprising:
      an active layer;
      a gate electrode comprising a gate bottom electrode and a gate top electrode;
      a source electrode; and
      a drain electrode;
   an organic electroluminescent (EL) device electrically connected to the TFT and comprising a stack of a pixel electrode at the same layer as and comprising the same material as the gate bottom electrode, an intermediate layer comprising an emissive layer, and a counter electrode;
   a first pad electrode at the same layer as and comprising the same material as the gate bottom electrode; and
   a second pad electrode comprising:
      a second pad bottom electrode at the same layer as and comprising the same material as the gate bottom electrode; and
      a second pad top electrode at the same layer as and comprising the same material as the gate top electrode.

2. The organic light emitting display device of claim 1, wherein two opposite ends of the second pad electrode are electrically connected to the first pad electrode, and
   the second pad electrode extends in a direction parallel to the first pad electrode.

3. The organic light emitting display device of claim 1, further comprising one or more insulation layers covering the second pad electrode.

4. The organic light emitting display device of claim 1, further comprising one or more insulation layers covering at least portions of the TFT, the organic EL device, the first pad electrode, and the second pad electrode,
   wherein at least one insulation layer of the one or more insulation layers has one or more openings, and
   the one or more openings and the second pad electrode do not overlap each other.

5. The organic light emitting display device of claim 1, wherein an end of the first pad electrode is exposed and is electrically connected to a driver IC for supplying a current for driving the organic light emitting display device.

6. The organic light emitting display device of claim 5, wherein at least a part of a current input via the first pad electrode is transmitted to the TFT and the organic EL device via the second pad electrode.

7. The organic light emitting display device of claim 1, wherein the gate bottom electrode, the pixel electrode, the first pad electrode, and the second pad bottom electrode comprise one or more of ITO, IZO, ZnO, or $In_2O_3$.

8. The organic light emitting display device of claim 1, wherein the gate top electrode and the second pad top electrode comprise one or more materials selected from among Ag, Mg, Al, Pt, Pd, Au, Ni, Nd, Ir, Cr, Li, Ca, Mo, Ti, W, MoW, Al/Cu, or combinations thereof.

9. The organic light emitting display device of claim 8, wherein the gate top electrode and the second pad top electrode have a triple layer structure of Mo—Al—Mo.

10. An organic light emitting display device comprising:
    a first insulation layer on a substrate;
    an active layer of a TFT on the first insulation layer;
    a second insulation layer covering the active layer;
    a pixel electrode on the second insulation layer;
    a gate bottom electrode on the active layer and at the same layer as and comprising the same material as the pixel electrode;
    a first pad electrode at the same layer as and comprising the same material as the gate bottom electrode and spaced from the gate bottom electrode;
    a second pad bottom electrode at the same layer as and comprising the same material as the first pad electrode and electrically connected to the first pad electrode;
    a gate top electrode on the gate bottom electrode;
    a second pad top electrode on the same layer as and comprising the same material as the gate top electrode and on the second pad bottom electrode;
    a third insulation layer covering at least portions of the pixel electrode, the gate top electrode, the first pad electrode, and the second pad top electrode; and
    a source electrode and a drain electrode on the third insulation layer, one of the source electrode or the drain electrode contacting the pixel electrode.

11. The organic light emitting display device of claim 10, wherein the second pad electrode has a U-shape, and
    ends of the U-shaped second pad electrode are connected to the first pad electrode.

12. The organic light emitting display device of claim 10, wherein at least a part of a current input via the first pad electrode is transmitted to the TFT and an organic EL device via the second pad electrode.

13. The organic light emitting display device of claim 10, wherein the gate bottom electrode, the pixel electrode, the first pad electrode, and the second pad bottom electrode comprise one or more of ITO, IZO, ZnO, or $In_2O_3$.

14. The organic light emitting display device of claim 10, wherein the gate top electrode and the second pad top electrode comprise one or more materials selected from among Ag, Mg, Al, Pt, Pd, Au, Ni, Nd, Ir, Cr, Li, Ca, Mo, Ti, W, MoW, Al/Cu, or combinations thereof.

15. The organic light emitting display device of claim 14, wherein the gate top electrode and the second pad top electrode have a triple layer structure of Mo—Al—Mo.

* * * * *